(12) United States Patent
Yamazaki et al.

(10) Patent No.: US 11,749,511 B2
(45) Date of Patent: Sep. 5, 2023

(54) PLASMA OBSERVATION SYSTEM AND PLASMA OBSERVATION METHOD

(71) Applicant: Tokyo Electron Limited, Tokyo (JP)

(72) Inventors: Ryoji Yamazaki, Yamanashi (JP); Hiroyuki Miyashita, Yamanashi (JP); Mikio Sato, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 161 days.

(21) Appl. No.: 17/149,150

(22) Filed: Jan. 14, 2021

(65) Prior Publication Data
US 2021/0225623 A1    Jul. 22, 2021

(30) Foreign Application Priority Data

Jan. 22, 2020 (JP) .................................. 2020-008508

(51) Int. Cl.
*H01J 37/32* (2006.01)
*G01J 3/02* (2006.01)
*G01J 3/28* (2006.01)

(52) U.S. Cl.
CPC ......... *H01J 37/32972* (2013.01); *G01J 3/021* (2013.01); *G01J 3/0218* (2013.01); *G01J 3/28* (2013.01); *H01J 37/32192* (2013.01); *H01J 37/32449* (2013.01); *H01J 37/32963* (2013.01); *H01J 2237/334* (2013.01); *H01J 2237/335* (2013.01)

(58) Field of Classification Search
USPC .................................................. 156/345.24
See application file for complete search history.

(56) References Cited

U.S. PATENT DOCUMENTS

| | | | | |
|---|---|---|---|---|
| 2002/0139925 | A1* | 10/2002 | Mitrovic | G01N 21/68 250/226 |
| 2015/0124250 | A1* | 5/2015 | Bao | G01N 21/68 356/316 |
| 2016/0300699 | A1* | 10/2016 | Kim | G01J 3/0248 |
| 2017/0254755 | A1* | 9/2017 | Cho | G01J 3/0208 |

FOREIGN PATENT DOCUMENTS

| | | |
|---|---|---|
| JP | H11-288921 A | 10/1999 |
| JP | 2001-250812 A | 9/2001 |
| KR | 10-2016-0079050 A | 7/2016 |
| KR | 10-2020-0003999 A | 1/2020 |

\* cited by examiner

*Primary Examiner* — Ram N Kackar
(74) *Attorney, Agent, or Firm* — Venjuris, P.C.

(57) ABSTRACT

A plasma observation system includes a plasma processing apparatus which includes a processing container in which a substrate is processed with plasma, and a plurality of observation windows each capable of observing an emission state of the plasma in the processing container; and a measuring device including a light receiver configured to receive a plurality of light beams intersecting in the processing container through a plurality of observation windows, and a controller configured to specify an observation point of the plasma and determine a state of the plasma at the observation point based on the plurality of light beams received by the light receiver.

15 Claims, 8 Drawing Sheets

PLASMA OBSERVATION SYSTEM AND PLASMA OBSERVATION METHOD

CROSS-REFERENCE TO RELATED APPLICATIONS

This application is based on and claims priority from Japanese Patent Application No. 2020-008508 filed on Jan. 22, 2020 with the Japan Patent Office, the disclosure of which is incorporated herein in its entirety by reference.

TECHNICAL FIELD

The present disclosure relates to a plasma observation system and a plasma observation method.

BACKGROUND

Japanese Patent Laid-Open Publication No. 2001-250812 proposes an end point detection method and an end point detection device for a plasma processing, which are capable of stably and accurately detecting the end point of the plasma processing.

Further, Japanese Patent Laid-Open Publication No. 11-288921 proposes a method including detecting the light of a predetermined wavelength emitted from plasma with which a substrate is processed, and extracting a signal component that changes according to the progress of a plasma processing from the emission signals of the detected light of a predetermined wavelength at a predetermined cycle. The method further includes detecting the end point of the plasma processing based on the intensity change of the extracted signal component, and terminating the substrate processing based on the detected end point of the plasma processing.

SUMMARY

According to an embodiment, the present disclosure provides a plasma observation system including a plasma processing apparatus including a processing container in which a substrate is processed with plasma, and a plurality of observation windows each capable of observing an emission state of the plasma in the processing container; and a measuring device including a light receiver configured to receive a plurality of light beams intersecting in the processing container through a plurality of observation windows, and a controller configured to specify an observation point of the plasma and determine a state of the plasma at the observation point based on the plurality of light beams received by the light receiver.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
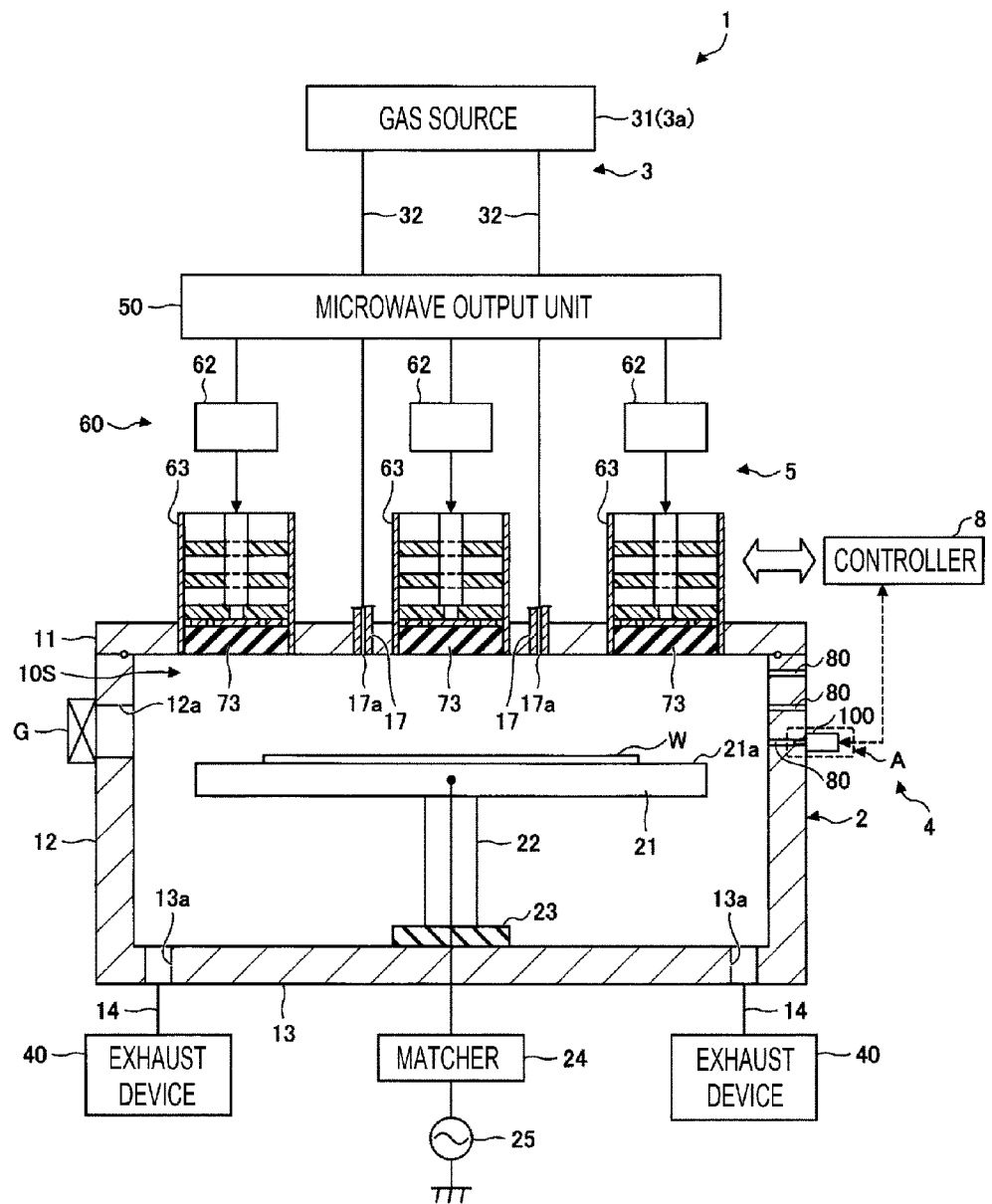
FIG. 1 is a view illustrating a plasma observation system according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings. In each drawing, the same components may be denoted by the same reference numerals, and duplicate description may be omitted.

[Plasma Observation System]

A plasma observation system 1 according to an embodiment will be described with reference to FIG. 1. FIG. 1 is a view illustrating an exemplary plasma observation system according to an embodiment. The plasma observation system includes a plasma processing apparatus 1 that processes a substrate with plasma in a processing container 2, and a measuring device 4 that measures the plasma in the processing container 2.

[Plasma Processing Apparatus]

The plasma processing apparatus 1 according to the embodiment performs a substrate processing such as an etching processing, a cleaning processing, a film forming processing, a diffusion processing, and an ashing processing on, for example, a substrate W such as a semiconductor wafer for manufacturing a semiconductor device, with a plurality of continuous operations.

The plasma processing apparatus 1 includes a processing container 2, a stage 21, a gas supply mechanism 3, an exhaust device 40, a microwave introducing module 5, and a controller 8. The processing container 2 accommodates the substrate W that is a workpiece. The stage 21 is disposed inside the processing container 2, and includes a placing surface 21a on which the substrate W is placed. The gas supply mechanism 3 supplies a gas into the processing container 2. The exhaust device 40 exhausts the inside of the processing container 2 to reduce the pressure. The microwave introducing module 5 introduces microwaves for plasma generation into the processing container 2. The controller 8 controls each part of the plasma processing apparatus 1.

The processing container 2 has, for example, a substantially cylindrical shape. The processing container 2 is made of, for example, a metal material such as aluminum and an alloy thereof. A plasma space 10S is above the substrate W of the processing container 2.

A plurality of observation windows 80 is provided in the side wall of the processing container 2. Each of the observation windows 80 is made of, for example, a sapphire that transmits light, and allows light to pass therethrough in order to observe the state of plasma in the processing container 2 while maintaining airtightness in the processing container 2. For example, the emission state of the plasma may be observed from a plurality of observation windows 80. A plurality of observation windows 80 are provided on the side wall of the processing container 2 above the substrate W placed on the placing surface 21a. In an example of FIG. 1, three observation windows 80 are provided in the vertical direction, but the number and arrangement of the observation windows 80 are not limited thereto. For example, a plurality of observation windows 80 may be provided in the horizontal direction (circumferential direction), or a plurality of observation windows 80 may be provided in both the vertical direction and the horizontal direction. A light beam that has passed through the observation windows 80 is received by a light receiver 100.

The processing container 2 includes a plate-shaped top wall 11, a bottom wall 13, and a side wall 12 that connects the top wall 11 and the bottom wall 13. The top wall 11 includes a plurality of openings. The side wall 12 includes a carry-in/out port 12a configured to perform the carry-in/out of the substrate W to/from a transfer chamber (not illustrated) adjacent to the processing container 2. A gate valve G is disposed between the processing container 2 and the transfer chamber (not illustrated). The gate valve G has a function of opening/closing the carry-in/out port 12a. The gate valve G hermetically seals the processing container 2 in a closed state, and enables the transfer of the substrate W between the processing container 2 and the transfer chamber (not illustrated) in an opened state.

The bottom wall 13 includes a plurality of (two in FIG. 1) exhaust port 13a. The plasma processing apparatus 1 further includes an exhaust pipe 14 that connects the exhaust port 13a and the exhaust device 40. The exhaust device 40 includes an APC valve and a high-speed vacuum pump capable of reducing the pressure of the internal space of the processing container 2 to a predetermined vacuum degree at a high speed. The examples of the high-speed vacuum pump include a turbo molecular pump. The pressure of the internal space of the processing container 2 is reduced to a predetermined vacuum degree, for example, 0.133 Pa, by operating the high-speed vacuum pump of the exhaust device 40.

The plasma processing apparatus 1 further includes a support member 22 that supports the stage 21 in the processing container 2, and an insulating member 23 provided between the support member 22 and the bottom wall 13. The stage 21 is configured to horizontally place the substrate W. The support member 22 has a cylindrical shape extending from the center of the bottom wall 13 toward the internal space of the processing container 2. The stage 21 and the support member 22 are made of, for example, aluminum having a surface to which an alumite processing (anodizing processing) is performed.

The plasma processing apparatus 1 further includes a radio-frequency bias power supply 25 that supplies a radio-frequency power to the stage 21, and a matcher 24 provided between the stage 21 and the radio-frequency bias power supply 25. The radio-frequency bias power supply 25 supplies a radio-frequency power to the stage 21 to attract ions to the substrate W. The matcher 24 includes a circuit configured to match the output impedance of the radio-frequency bias power supply 25 and the impedance of the load side (the stage 21 side).

The plasma processing apparatus 1 may further include a temperature control mechanism (not illustrated) that heats or cools the stage 21. The temperature control mechanism controls, for example, the temperature of the substrate W within a range of 25° C. (room temperature) to 900° C.

The plasma processing apparatus 1 further includes a plurality of gas introducing pipes 17. The gas introducing pipes 17 are provided in the top wall 11, and supply a processing gas from gas supply holes 17a. Meanwhile, the gas introducing pipes 17 may be provided in the top wall 11 and/or the side wall 12.

A gas source 31 is used as a gas source of, for example, a rare gas for plasma generation, or a gas used for an oxidation processing, a nitriding processing, a film forming processing, an etching processing, and an ashing processing.

The gas supply mechanism 3 includes a gas supply device 3a including the gas source 31, and a pipe 32 that connects the gas source 31 and the plurality of gas introducing pipes 17. Although one gas source 31 is illustrated in FIG. 1, the gas supply device 3a may include a plurality of gas sources depending on the type of gas used.

The gas supply device 3a further includes a mass flow controller and an opening/closing valve (not illustrated) provided in the middle of the pipe 32. The type of gas supplied into the processing container 2 or the flow rates of the gases are controlled by the mass flow controller and the opening/closing valve.

The microwave introducing module 5 is disposed above the processing container 2, and functions as a plasma generating unit that introduces electromagnetic waves (microwaves in the embodiment) into the processing container 2 to generate plasma.

The microwave output unit 50 includes a power supply unit, a microwave oscillator, an amplifier that amplifies the microwaves oscillated by the microwave oscillator, and a distributor that distributes the microwaves amplified by the amplifier into a plurality of paths. The microwave oscillator oscillates microwaves at a predetermined frequency (e.g., 2.45 GHz). The distributor distributes the microwaves while matching the impedances on the input side and the output side.

The microwave introducing module 5 has a plurality of plasma sources that input desired microwave power into the processing container 2. In the embodiment, the microwave introducing module 5 has seven plasma sources. Each plasma source has an amplifier unit 62 and a microwave introduction mechanism 63 constituting an antenna unit 60. Each of the seven plasma sources may independently control the power of the microwaves. In the embodiment, the configurations of the seven plasma sources are all the same. The antenna unit 60 has an amplifier unit 62 that mainly amplifies and outputs the distributed microwaves, and introduces the microwaves amplified by the amplifier unit 62 into the microwave introduction mechanism 63.

The seven microwave introduction mechanisms 63 are provided on the top wall 11. Each of the microwave introduction mechanism 63 has a tuner for matching impedance and an antenna unit for radiating the amplified microwaves into the processing container 2. Further, the microwave introduction mechanism 63 has a cylindrical outer conductor extending in the vertical direction and an inner conductor extending in the vertical direction in the main body container. The outer conductor and the inner conductor constitute a coaxial tube. The space between the inner peripheral surface of the outer conductor and the outer peripheral surface of the inner conductor forms a microwave transmission path. The microwaves propagating in the microwave transmission path of the microwave introduction mechanism 63 passes through the dielectric window 73 and is introduced into the plasma space 10S.

Each of the components of the plasma processing apparatus 1 is controlled by the controller 8. Typically, the controller 8 may be, for example, a computer. The controller 8 has a process controller including a CPU, a user interface connected to the process controller, and a storage unit.

The process controller is a control means configured to collectively control each component involved in, for example, process conditions such as temperature, pressure, a gas flow rate, and a microwave power in the plasma processing apparatus 1. Each of the components may be, for example, the radio-frequency bias power supply 25, the gas supply device 3a, the exhaust device 40, and the microwave introducing module 5.

The user interface includes, for example, a keyboard or a touch panel for inputting, for example, commands by a process manager to manage the plasma processing apparatus 1, and a display for visually displaying the operation status of the plasma processing apparatus 1.

The storage unit stores a control program for realizing various processings performed in the plasma processing apparatus 1 by the control of the process controller, or recipe in which processing condition data is recorded. The process controller calls and executes an arbitrary control program or a recipe from the storage unit as needed, such as an instruction from the user interface. Therefore, a desired processing is performed in the processing container 2 of the plasma processing apparatus 1 under the control of the process controller.

Examples of the control program and recipe described above may include those stored in a computer-readable storage medium such as a flash memory, a DVD, or a Blu-ray disk. Further, the above-mentioned recipe may be used on-line by being transmitted from another device at any time via, for example, a dedicated line.

(Measuring Device)

The measuring device 4 measures the plasma in the processing container 2 through a plurality of observation windows 80. The measuring device 4 includes a light receiver 100 and a controller 8. The light receiver 100 receives a plurality of light beams whose optical axes intersect in the processing container 2, from the plurality of observation windows 80. The controller 8 specifies a plasma observation point and determines a state of the plasma at the specified observation point based on the plurality of light beams received by the light receiver 100. In the embodiment, the light receiver 100 observes the light emission state of the plasma in the plasma space 10S through the plurality of observation windows 80.

The light receiver 100 is shared by two or more observation windows 80. For example, the light receiver 100 may be shared by two or more observation windows 80 provided in the horizontal direction. For example, the light receiver 100 may be shared by two or more observation windows 80 provided in the vertical direction. In the example of FIG. 1, one light receiver 100 is provided and shared by three observation windows 80 provided in the vertical direction. As a result, it is not necessary to provide the same number of light receivers 100 with respect to the observation windows 80, and it is possible to reduce the number of light receivers 100.

(Light Receiver)

Figure 2:
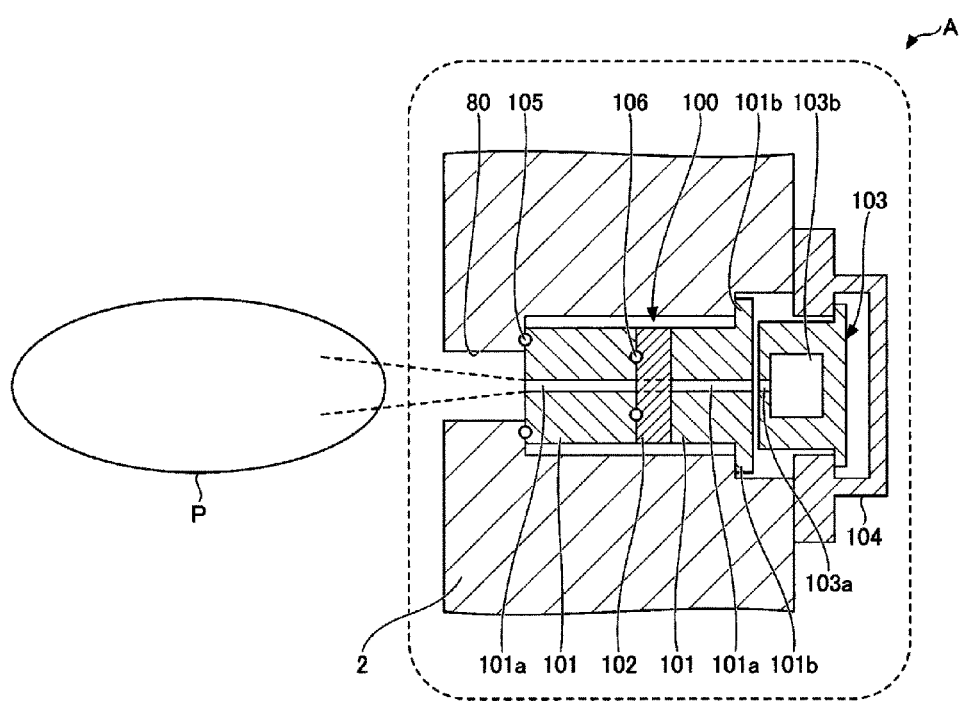
FIG. 2 is a cross-sectional view illustrating a light receiver according to the embodiment.

Next, a configuration of the light receiver 100 will be described with reference to FIG. 2. FIG. 2 is a cross-sectional view illustrating the light receiver 100 according to the embodiment, and is a cross-sectional view of the light receiver 100 in the frame A of FIG. 1.

In FIG. 1, only one light receiver 100 is illustrated in the observation windows 80 of the processing container 2. However, when a plurality of observation windows 80 are provided in the horizontal direction, the same number of light receivers 100 as the observation windows 80 may be provided for each observation window 80. As illustrated in FIG. 2, the light receiver 100 includes a cylindrical member 101 on which a pinhole 101a (directional pinhole) is formed, a vacuum partition glass 102, a spectroscopic sensor 103, and a protective cover 104.

The cylindrical member 101 is made of a conductive member such as aluminum. The cylindrical member 101 has a structure in which a cylindrical vacuum partition glass 102 is sandwiched between the cylindrical members 101. A pinhole 101a penetrates the center of the cylindrical member 101 in the longitudinal direction. The pinhole 101a is formed in a hole size such that a radio-frequency current does not flow inside the pinhole 101a. The vacuum partition glass 102 is made of, for example, sapphire. The vacuum partition glass 102 functions as a partition that blocks the communication between the vacuum space of the processing container 2 and the external atmosphere space by the pinhole 101a. When the vacuum partition glass 102 is exposed to plasma, the glass becomes cloudy due to the adhesion of reaction products, and the light transmittance deteriorates. Therefore, the vacuum partition glass 102 is not be exposed to plasma while being sandwiched between the cylindrical members 101.

The cylindrical member 101 is arranged at a position and a direction in which a light beam from the plasma space 10S enters the pinhole 101a through the observation window 80. A spectroscopic sensor 103 is provided close to the cylindrical member 101 on the outside of the cylindrical member 101 in a state of being covered with a protective cover 104. At the outer end of the cylindrical member 101, a disc-shaped protrusion 101b is in annular contact with a step provided in the processing container 2.

The spectroscopic sensor 103 is arranged such that a slit 103a is located on the extension line of the pinhole 101a, and the light beam passing through the slit 103a is received by a light receiving unit 103b. The protective cover 104 contacts the outer wall of the processing container 2 and surrounds the spectroscopic sensor 103 from the outside to block light.

An O-ring 105 is provided on the surface of the cylindrical member 101 that comes into contact with the processing container 2 on the observation window 80 side. Further, an O-ring 106 is provided on the contact surface of the cylindrical member 101 with the vacuum partition glass 102 on the opposite side of the surface on which the O-ring 105 is provided. The O-rings 105 and 106 block the vacuum space of the processing container 2 from the external atmosphere space and maintain the airtightness inside the processing container 2.

The light beam emitted in the plasma space 10S passes through the observation window 80→pinhole 101a→vacuum partition glass 102→pinhole 101a→slit 103a and is received by the light receiving unit 103b. The pinhole 101a has directivity and defines the optical axis of the received light beam. FIG. 2 illustrates a form in which the spectroscopic sensor 103 is directly installed on the outer wall of the processing container 2. However, different modes may be used when the spectroscopic sensor 103 is shared by a plurality of observation windows 80 or when pinholes 101a facing a plurality of directions are provided in one observation window 80. In this case, only the cylindrical member 101 may be installed in the observation window 80, the cylindrical member 101 and the spectroscopic sensor 103 may be connected by an optical fiber, and then the spectroscopic sensor 103 may be installed at a position where the spectroscopic sensor 103 can be shared. In the following description, the light receiver 100 will be described, including a form in which the spectroscopic sensor 103 is directly installed on the outer wall of the processing container 2, as well as a form in which the cylindrical member 101 and the spectroscopic sensor 103 are connected by an optical fiber, and the spectroscopic sensor 103 is installed at a position that the spectroscopic sensor 103 can be shared.

[Rotary Mirror Mode]

Figures 4A, 4B:
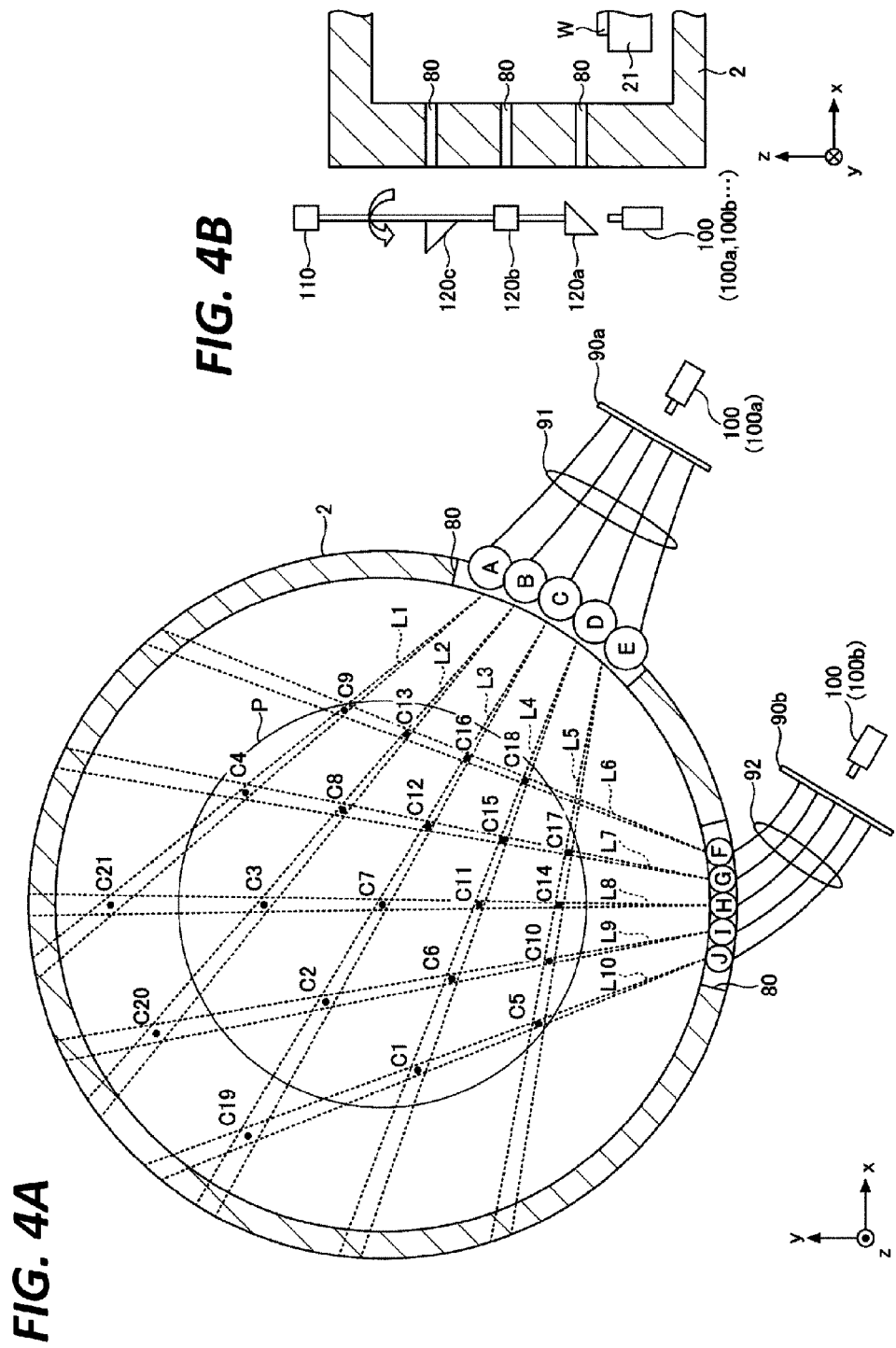
FIGS. 4A and 4B are views illustrating an exemplary plasma observation method according to a second embodiment.

In FIG. 1, three observation windows 80 are arranged in the vertical direction, and the light beam passing through each of the three observation windows 80 is received by one receiver 100. As an example, as illustrated in FIG. 4B, three rotary mirrors (prisms) 120a, 120b, and 120c are arranged one-to-one with respect to the three observation windows 80 near the three observation windows 80 and outside the processing container 2. The rotary mirrors 120a, 120b, and 120c are fixed to a rotary rod 111 at different angles. For example, the rotary mirrors 120a, 120b, and 120c are fixed around the rotary rod 111 at different angles by 120°, and rotate by driving a stepping motor 110 attached to the rotary rod 111. The light beam of the plasma that has passed through each of the three observation windows 80 arranged in the vertical direction is reflected by the rotary mirrors 120a, 120b, and 120c, which reflect the light beam toward the light receiver 100 at time intervals according to the rotation speed of the rotary rod 111.

In this way, each light beam of the plasma passing through the three observation windows 80 is reflected by the rotary mirrors 120a, 120b, and 120c, respectively. Then, by rotating the rotary mirrors 120a, 120b, and 120c, the light beam reflected by each of the rotary mirrors 120a, 120b, and 120c is reflected toward the light receiver 100 at different timings, and is received by the light receiver 100 at different timings. With such a configuration, the light receiver 100 may be shared by a plurality of observation windows 80 provided in the vertical direction.

(Plasma Observation According to First Embodiment)

Figure 3:
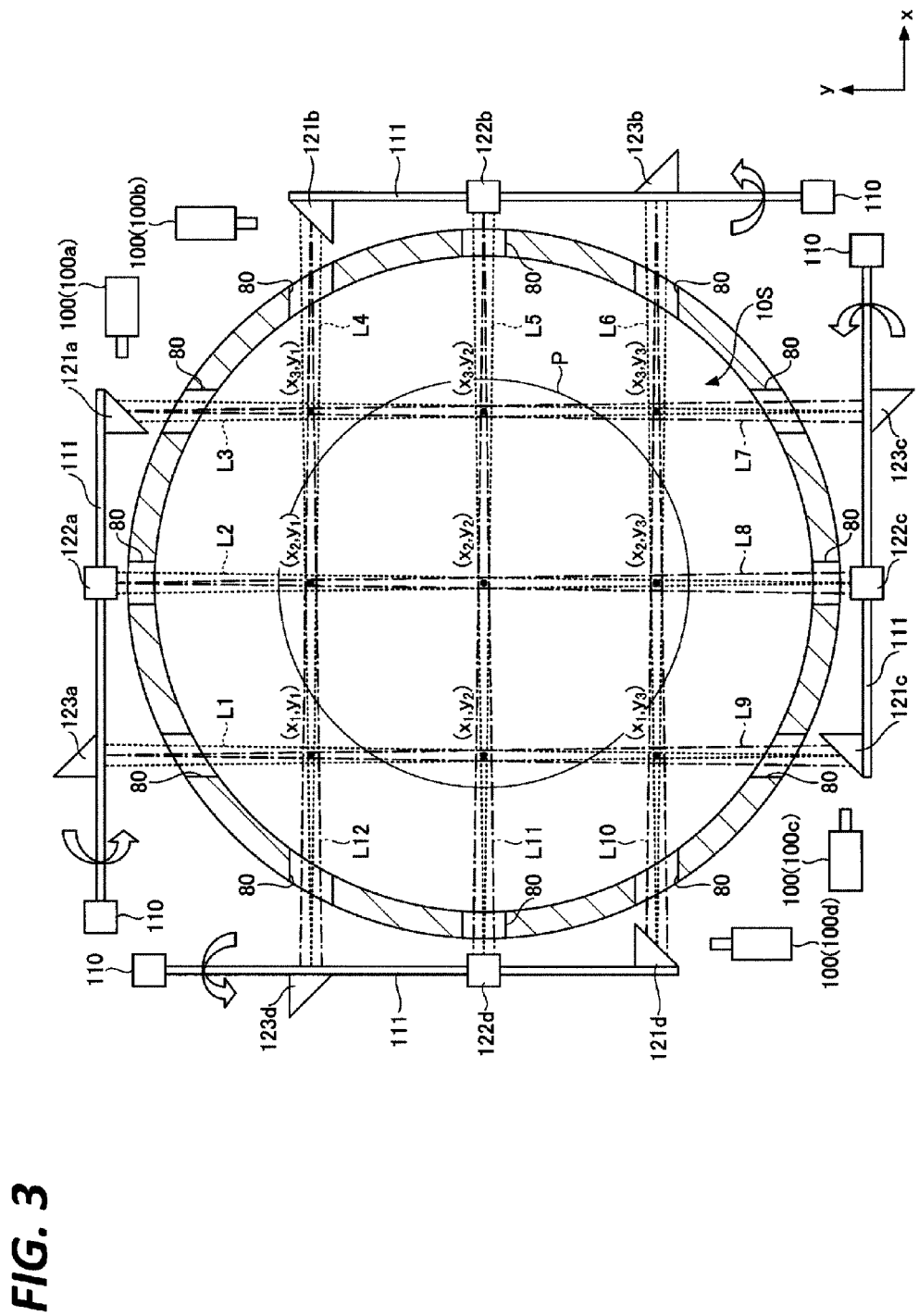
FIG. 3 is a view illustrating an exemplary plasma observation method according to a first embodiment.

Next, descriptions will be made on a configuration according to the first embodiment in which the light receiver 100 is shared by two or more observation windows 80 provided in the horizontal direction and the plasma is observed, with reference to FIG. 3. FIG. 3 is a view illustrating an exemplary plasma observation method according to the first embodiment. In this example, the processing container 2 is provided with 12 observation windows 80 in the horizontal direction. FIG. 3 is a top view of the processing container 2 cut in the horizontal direction at a height where 12 observation windows 80 are formed in the horizontal direction. The inside of the processing container 2 serves as a plasma space, and the emission of plasma P may be observed from each observation window 80.

Three rotary mirrors 121a, 122a, and 123a are arranged near the three observation windows 80 located on the upper side of the paper surface and on the outside of the processing container 2. The rotary mirrors 121a, 122a, and 123a are fixed to the rotary rod 111 at different angles and rotated by driving the stepping motor 110. The light beam of the plasma that has passed through each observation window 80 is reflected by the rotary mirrors 121a, 122a, and 123a, and is received by the light receiver 100 (100a) at time intervals according to the rotation speed of the rotary rod 111.

Three rotary mirrors 121b, 122b, and 123b are arranged near the three observation windows 80 located on the right side of the paper surface and on the outside of the processing container 2. The light beam of the plasma that has passed through each observation window 80 is reflected by the rotary mirrors 121b, 122b, and 123b, and is received by the light receiver 100 (100b) at time intervals according to the rotation speed of the rotary rod 111. The light receiver 100b may be the same light receiver 100 as the light receiver 100a, or may be a different light receiver 100.

Three rotary mirrors 121c, 122c, and 123c are arranged corresponding to the three observation windows 80 located on the lower side of the paper surface. The light beam of the plasma that has passed through each observation window 80 is reflected by the rotary mirrors 121c, 122c, and 123c, and is received by the light receiver 100 (100c) at time intervals according to the rotation speed of the rotary rod 111. The light receiver 100c may be the same light receiver 100 as the light receivers 100a and 100b, or may be a different light receiver 100.

Three rotary mirrors 121d, 122d, and 123d are arranged corresponding to the three observation windows 80 located on the left side of the paper surface. The light beam of the plasma that has passed through each observation window 80 is reflected by the rotary mirrors 121d, 122d, and 123d, and is received by the light receiver 100 (100d) at time intervals according to the rotation speed of the rotary rod 111. The light receiver 100d may be the same light receiver 100 as the light receivers 100a, 100b, and 100c, or may be a different light receiver 100.

The optical axes of light beams L1, L2, and L3 passing through the three observation windows 80 located on the upper side of the paper surface are the same axes as the optical axes of light beams L9, L8, and L7 passing through the three observation windows 80 located on the lower side of the paper surface.

The optical axes of light beams L4, L5, and L6 passing through the three observation windows 80 located on the right side of the paper surface are the same axes as the optical axes of light beams L12, L11, and L10 passing through the three observation windows 80 located on the left side of the paper surface.

The light receivers 100a to 100d and the controller 8 may determine which of the three observation windows the received light beam has passed through, based on a command value supplied to the stepping motor 110 or the rotation speed of the rotary rod 111, and the angle of each rotary mirror. For example, when the light receiver 100a receives the light beam L1 of the plasma and the light receiver 100b receives the light beam L4 of the plasma at the same point, the controller 8 specifies a coordinate (x1, y1) of the intersection of the light beam L1 and the light beam L4 received by the light receiver 100a and the light receiver 100b, respectively, as an observation point. The controller 8 determines the intensity of the light beam L1 and the light beam L4 at the specified observation point as an emission intensity of the plasma. The controller 8 may determine the average value of the intensity of the light beam L1 and the light beam L4 as the emission intensity of the plasma at the coordinate (x1, y1) of the plasma space 10S. The observed emission intensity is an example of the state of the plasma to be observed.

Further, when the light receivers 100a and 100c receive the light beams L1 and L9 of the plasma and the light receivers 100b and 100d receive the light beams L4 and L12 of the plasma at the same time, the controller 8 specifies a coordinates (x1, y1) of the intersection of the light beams L1, L4, L9, and L12, as an observation point. In this case as well, the controller 8 sets the coordinate (x1, y1) as an observation point and determines the intensity of the light beams L1, L4, L9, and L12 as the emission intensity of the plasma. The controller 8 may determine the average value of the intensity of the light beams L1, L4, L9, and L12 as the emission intensity of the plasma at the coordinate (x1, y1).

Only one of the opposing light receivers 100a and 100c, and only one set of the three rotary mirrors corresponding to each light receiver may be provided. Similarly, only one of the opposing light receivers 100a and 100c, and only one set of the three rotary mirrors corresponding to each light receiver may be provided.

Accordingly, a plurality of observation points may be specified, and it is possible to perform horizontal planar sensing at a plurality of observation points or sensing of a plasma space including a vertical direction. That is, it is possible to determine the emission intensity of the plasma at the coordinates (x1, y1) to (x3, y3) of a plurality of observation points in the plasma space 10S with a simple configuration, thereby enabling horizontal planar sensing. Further, the rotary mirror is rotated by the stepping motor 110, and the light beam incident through each observation window 80 is received by the light receiver 100 at a different timing. This enables sensing of the plasma space in the horizontal and vertical directions. Further, even when a plurality of light receivers 100 are used, the plasma observation system may be constructed at a relatively low cost because the optical system components corresponding to the iris and the collimator are simply configured by the cylindrical member 101.

In the plasma observation method according to the first embodiment of FIG. 3, the observation windows 80 are provided at substantially equal intervals in the horizontal direction. However, it is not necessary to provide the observation windows 80 at substantially equal intervals in the horizontal direction. Further, a plurality of observation windows 80 may be provided in the horizontal direction and in the vertical direction (see FIG. 4B). The processing container 2 may be provided with two or more observation windows 80 arranged such that light beams whose optical axes intersect with each other are observed inside.

[Combination of Rotary Mirror Method and Chopping Method]

(Plasma Observation According to Second Embodiment)

Next, descriptions will be made on a configuration in which the light receiver 100 is shared by two observation windows 80 provided in the horizontal direction and three observation windows 80 provided in the vertical direction, with reference to FIGS. 4A and 4B. FIGS. 4A and 4B are views illustrating an exemplary plasma observation method according to a second embodiment. In this example, the processing container 2 is provided with two observation windows 80 in the horizontal direction. FIG. 4A is a top view of the processing container 2 cut in the horizontal direction at a height where two observation windows 80 are formed in the horizontal direction. The inside of the processing container 2 serves as a plasma space, and the emission of plasma P may be observed from each observation window 80. The light receivers 100a and 100c illustrated in FIGS. 4A and 4B may be the same light receivers 100, or may be different light receivers 100.

As illustrated in FIG. 4A, A to E illustrated in one observation window 80 are light beams in five directions A to E that are observable from one observation window 80. F to J illustrated in the other observation window 80 are light beams in five directions F to J that are observable from the other observation window 80.

The light beams received from the one observation windows 80 enter a chopper 90a via five optical fibers 91 and are received by the light receiver 100 (referred to as the light receiver 100a). The chopper 90a has slits having different widths, and is configured to separate light beams from different directions A to E. That is, when the chopper 90a is rotated, for example, the light beam in the direction A blinks in a longer cycle, the light beam in the direction B blinks in a shorter cycle. Therefore, by detecting the blinking time interval of the light beams, the light beams in the five directions A to E may be separated and detected by the chopper 90a.

In this way, the light beams from the five optical fibers 91 are separated by the chopper 90a, and the light beam from each direction is received by the light receiver 100a. Similarly, the light beams in the directions F to J illustrated in the other observation window 80 are received by the chopper 90b via five optical fibers 92, separated by the chopper 90b, and received by the light receiver 100 (100b). Thus, the emission intensity of the plasma at a plurality of observation points C1 to C21 in the plasma space 10S may be determined by the two observation windows 80 and the light receivers 100a and 100b with a simple configuration.

Further, as illustrated in FIG. 4B, three observation windows 80 are provided in the directions perpendicular to the two observation windows of FIG. 4A. In this case, the rotary mirrors 120a, 120b, and 120c are arranged near the three observation windows 80 and outside the processing container 2. The light beams of the plasma that have passed through the three observation windows 80 are reflected by the rotary mirrors 120a, 122a, and 123a, and received by the light receivers 100 (100a and 100b) at time intervals according to the rotation speed of the rotary rod 111.

With this configuration, the emission intensity of the plasma at the coordinates of 63 (=21×3) observation points with respect to the horizontal and vertical directions of the plasma space 10S may be determined by the six observation windows 80 and the two light receivers 100 with simple configuration, and the measurement resolution may be improved. Further, in the plasma observation according to the second embodiment, the observation point of the plasma space 10S, that is, the intersection of the respective light beams L1 to L10 is set at a position close to the side wall or the top wall of the processing container 2, so that the state of the plasma near the side wall or the top wall may be observed.

In order to specify the observation point, the number of observation windows 80 in the horizontal direction and the number of observation windows 80 in the vertical direction may be any number as long as at least two observation windows 80 are arranged in the horizontal direction and/or the vertical direction, and the light beams received by the respective observation windows 80 intersect. That is, the light beams received from the two or more observation windows 80 may be two or more light beams in different directions and intersect with each other.

[Cleaning Processing]

Figure 5:
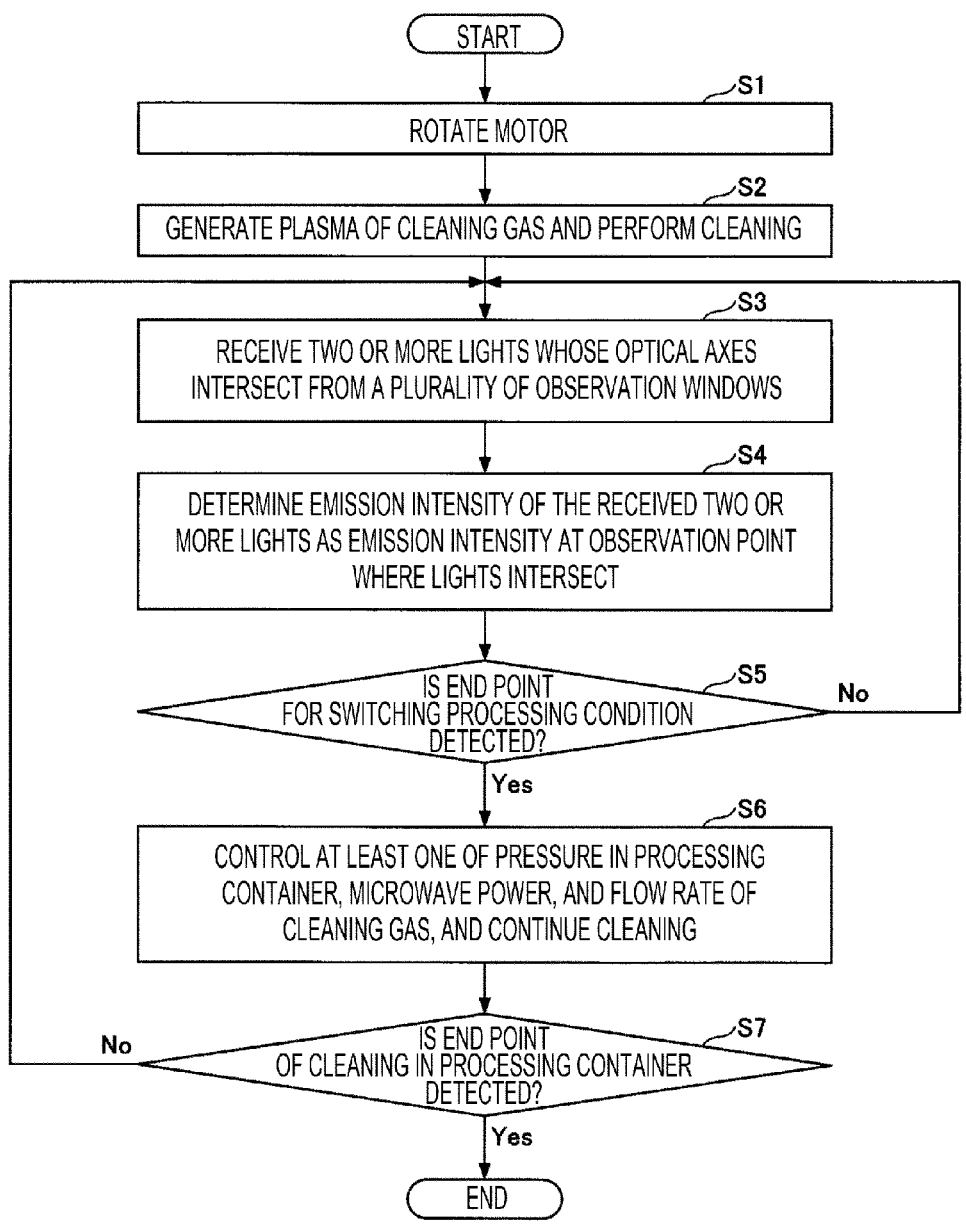
FIG. 5 is a flowchart illustrating a cleaning processing according to an embodiment.

Next, a cleaning processing according to an embodiment will be described with reference to FIG. 5. FIG. 5 is a flowchart illustrating a cleaning processing according to an embodiment. In the cleaning processing, the end point of the cleaning process is detected by using the plasma observation system according to each embodiment. This processing is controlled by the controller 8.

When this processing is started, the controller 8 operates the stepping motor 110 to rotate the rotary rod 111 at a desired rotation speed (step S1). Next, the controller 8 supplies a cleaning gas such as $NF_3$ gas from the gas source 31 into the processing container 2, and generates a plasma of the cleaning gas in the plasma space 10S by the power of the microwaves output from the microwave output unit 50 (step S2). The inside of the processing container 2 is cleaned with the generated plasma of the cleaning gas.

Next, the controller 8 receives the light beam passing through a plurality of observation windows 80 by the light receiver 100 (step S3). The light beams passing through the plurality of observation windows 80 and received by the light receiver 100 are two or more light beams whose optical axes intersect in the plasma space 10S.

Next, the controller 8 specifies a position where two or more received light beams intersect as an observation point, and determines the emission intensity of the two or more received light beams as the emission intensity at the specified observation point (step S4).

Next, the controller 8 determines whether or not the end point for switching the cleaning processing conditions has been detected (step S5). The end point for switching the cleaning processing conditions is predetermined. For example, the time point at which the first point specified as the observation point is cleaned by about 70% may be predetermined as the end point for switching the processing conditions. Even though the processing conditions are switched to change the priority cleaning location from the first cleaning location to the second observation location, the first location is also cleaned to some extent. Therefore, the first cleaning location is also 100% cleaned in the end.

When the controller 8 determines that the end point for switching the processing conditions is not detected, the processing returns to step S3 and continues cleaning under the current processing conditions. Meanwhile, when the controller 8 determines that the end point for switching the processing conditions has been detected, the processing proceeds to step S6. The controller 8 controls at least one of the pressure in the processing container 2, the microwave power, and the flow rate of the cleaning gas, and continues cleaning the second location, which is the next observation point (step S6).

Next, the controller 8 determines whether or not an index location, that is, the cleaning end point of all the observation points have been detected (step S7). Accordingly, it is determined whether or not the cleaning inside the processing container is completed. As for the cleaning end point, when a desired change occurs in the emission intensity of the received light beam having a certain wavelength, the controller 8 determines that the cleaning end point has been detected, and terminates the processing. Since the observation points C19 to C21 in FIG. 4A are close to the wall surface of the processing container 2, it can be said that the observation points C19 to C21 are preferable as observation points for completely cleaning the wall surface without overetching.

Meanwhile, when the controller 8 determines that the cleaning end point of the index location has not been detected, the controller 8 returns the processing to step S3 and executes steps S3 to S7 again, thereby receiving light beams from the plurality of observation windows 80 again. Then, the cleaning end point of the specified observation point is detected again from the emission intensity of the specified observation point. In step S4, the end point is detected at the observation point from the emission intensity of the observation point near the side wall of the processing container 2, and when the end point is not detected at the observation point from the emission intensity of the observation point near the top wall 11, it is determined that the end point for switching the processing condition is detected (step S5). Then, the cleaning is not completed, but in this case, the processing conditions such as the pressure in the processing container 2 are switched so as to enhance the cleaning near the top wall 11, and the cleaning process is continued. The loop of steps S3 to S5 and the loop of steps S3 to S7 are repeated, and when the controller 8 detects the index location, that is, the cleaning end points of all the observation points in step S7, it is determined that the cleaning inside the processing container is completed, and the processing is terminated.

The strength of the observed emission intensity indicates the state of completion of cleaning at the observation point. At an observation point where cleaning is not completed, controls such as changing the gas flow rate and/or changing the pressure are performed. For example, by controlling the pressure, the diffusion of the cleaning gas may be controlled. As a result, the end point of cleaning may be detected while performing a control to change the state of plasma such that cleaning is further promoted according to the determination result.

Figure 6A:
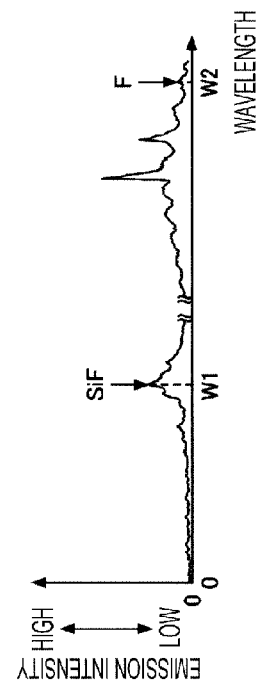
FIGS. 6A and 6B are diagrams illustrating an example of the plasma observation result.
Figure 6B:
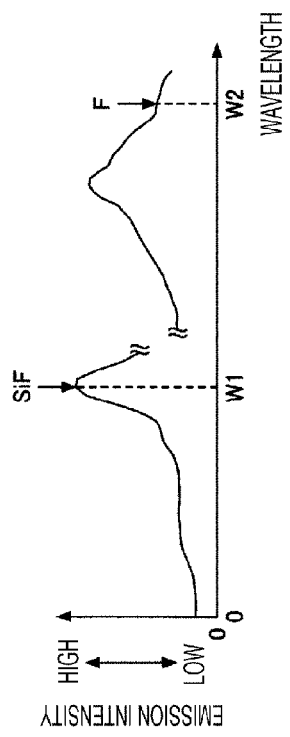

FIGS. 6A and 6B are diagrams illustrating an example of the plasma observation result. FIG. 6A illustrates an example of the result of observing the emission intensity of plasma using a relatively inexpensive spectroscopic sensor 103 having a half width of about 15 nm built in the light receiver 100 according to the embodiment. FIG. 6B illustrates an example of the result of observing the emission intensity of plasma using a relatively expensive spectroscopic sensor having a half width of about 1 nm.

FIGS. 6A and 6B both illustrate the emission intensity of each wavelength received by the spectroscopic sensor when the SiN film is cleaned with plasma of $NF_3$ gas. In the cleaning processing, the reaction product of Si produced by etching the SiN film is removed. In this case, in the observation results by any of the spectroscopic sensors illustrated in FIGS. 6A and 6B, light emission of a wavelength W1 corresponding to SiF is observed due to the reaction of Si and F in the $NF_3$ gas. When the emission of the wavelength W1 corresponding to SiF becomes lower than a predetermined threshold value, it is determined that the reaction product of Si at the observation point may be removed. Therefore, it may be determined that it is the end point of cleaning at the observation point.

In the observation results by any of the spectroscopic sensors illustrated in FIGS. 6A and 6B, the level of the light emission at the wavelength W1 was observed. As a result of observing the emission intensity of the plasma using the spectroscopic sensor 103 having a half width of about 15 nm built in the light receiver 100 according to the embodiment of FIG. 6A. Therefore, it was found that the same level of the emission intensity as in FIG. 6B could be detected, and the end point of the cleaning processing could be detected. That is, in the plasma observation system using the light receiver 100 according to the embodiment, it was possible to obtain an observation result comparable to the result of FIG. 6B in which the emission intensity of plasma was observed using an expensive spectroscopic sensor having a half width of about 1 nm.

The state of fluorine (F) in the processing container 2 may be determined from the light emission of wavelength W2, but the level of the light emission at the wavelength W2 was also observed in the observation results by any of the spectroscopic sensors illustrated in FIGS. 6A and 6B.

In the above-described embodiments, descriptions have been made on an example of detecting the end point of the cleaning processing using the plasma observation system according to each embodiment and determining the completion of the cleaning processing. However, the plasma observation system according to the embodiment may be used for detecting the end point of the etching process. As a result, the completion of the etching processing may be determined from the emission intensity at the observation point.

The state of the plasma to be observed is not limited to the detection of the end point of cleaning or etching based on the emission intensity, and may be the distribution of the plasma density based on the emission intensity. The state of film formation, the state of etching, and the state of cleaning may be determined based on the observed distribution of the plasma density. As a result, the film thickness distribution of the film forming processing may be controlled.

Regarding the observation position, there is an appropriate position depending on the process to be executed. For example, in the case of an etching processing or a film forming processing, it is desirable to observe the emission intensity above the substrate. Meanwhile, in the case of the cleaning processing, it is desirable to observe the light emission intensity both above the substrate and near the side wall and the top wall of the processing container 2.

Therefore, in processes such as etching processing and film forming processing, it is desirable to receive a plurality of light beams from two or more observation windows 80 provided in the horizontal direction such that a plurality of observation points are specified in the horizontal direction at a height relatively close to the substrate above the substrate. Thus, by determining the emission intensity of a plurality of observation points arranged in the horizontal direction above the substrate, it is possible to determine the state of the plasma at the plurality of observation points in the horizontal direction above the substrate. Further, it is more desirable to receive light beams from the observation windows 80 provided in the vertical direction and specify a plurality of observation points in the vertical direction as well. As a result, by specifying a plurality of observation points in the plasma space 10S in the horizontal direction and the vertical direction above the substrate and determining the emission intensity at each observation point, it is possible to determine the state of the plasma in the three-dimensional space above the substrate.

Meanwhile, in the case of the cleaning processing, it is desirable to receive light beams from a plurality of observation windows 80 arranged in the vertical direction such that the observation points are provided above the substrate as well as near the top wall 11 of the processing container 2. Thus, by determining the emission intensity of a plurality of observation points arranged in the vertical direction above the substrate, it is possible to observe the state of the plasma in the vertical direction near the substrate and the top wall above the substrate. Further, it is more desirable to receive light beams from the plurality of observation windows 80 in the horizontal direction and the vertical direction such that the observation points are also provided near the side wall. Therefore, it is possible to observe the state of the plasma near the substrate, the top wall, and the side wall, grasp the observation points where cleaning is insufficient, and control, for example, the pressure so as to change the state of the plasma. As a result, it is possible to efficiently perform cleaning.

In the step of changing the state of the plasma in the processing container 2 based on the results of specifying the observation point of the plasma and determining the state of the plasma, at least one of the pressure, microwave power, and gas flow rate in the processing container 2 may be controlled.

Machine learning may be performed in which the determination result of the state of the plasma at the specified observation point and at least one control amount of the pressure, microwave power, and gas flow rate are input to a learning machine to output the plasma density distribution. The model learned in this way may be used to estimate how the pressure, microwave power, and gas flow rate should be controlled based on the plasma observation point observed by the plasma observation system and the determination result of the state of the plasma. Thus, it is possible to perform a control to obtain a desired plasma density distribution with high accuracy.

In particular, the plasma processing apparatus 1 illustrated in FIG. 1 has seven plasma sources (see the antenna unit 60 and the microwave introduction mechanism 63 in FIG. 1), and independently controls the plasma sources, so that a desired microwave power is supplied from each of the plasma source into the processing container 2. Therefore, the power of the microwaves physically irradiated into the processing container 2 tends to be strong or weak depending on the positions of the seven plasma sources, and the state of the plasma in the circumferential direction may be biased.

Meanwhile, according to the plasma observation method according to the embodiment, it is possible to observe the state of the plasma in the horizontal direction and the vertical direction above the substrate. Then, by controlling the power of microwaves emitted from the seven plasma sources based on the observation results, it is possible to control the plasma density distribution and the emission intensity. Thus, the end point detection of cleaning and etching may be performed with high accuracy, and the film forming processing may be performed with high accuracy.

[Other Plasma Observations]

Figure 7B:
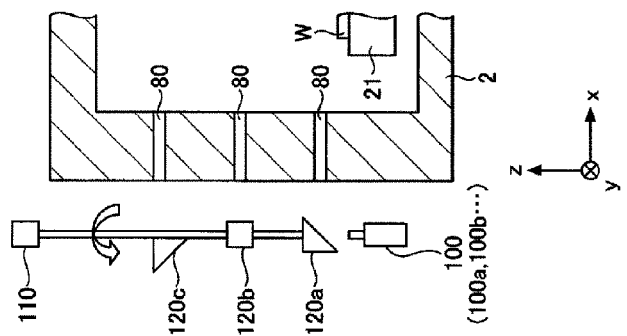
FIGS. 7A and 7B are views illustrating an exemplary plasma observation method according to a third embodiment.
Figure 7A:
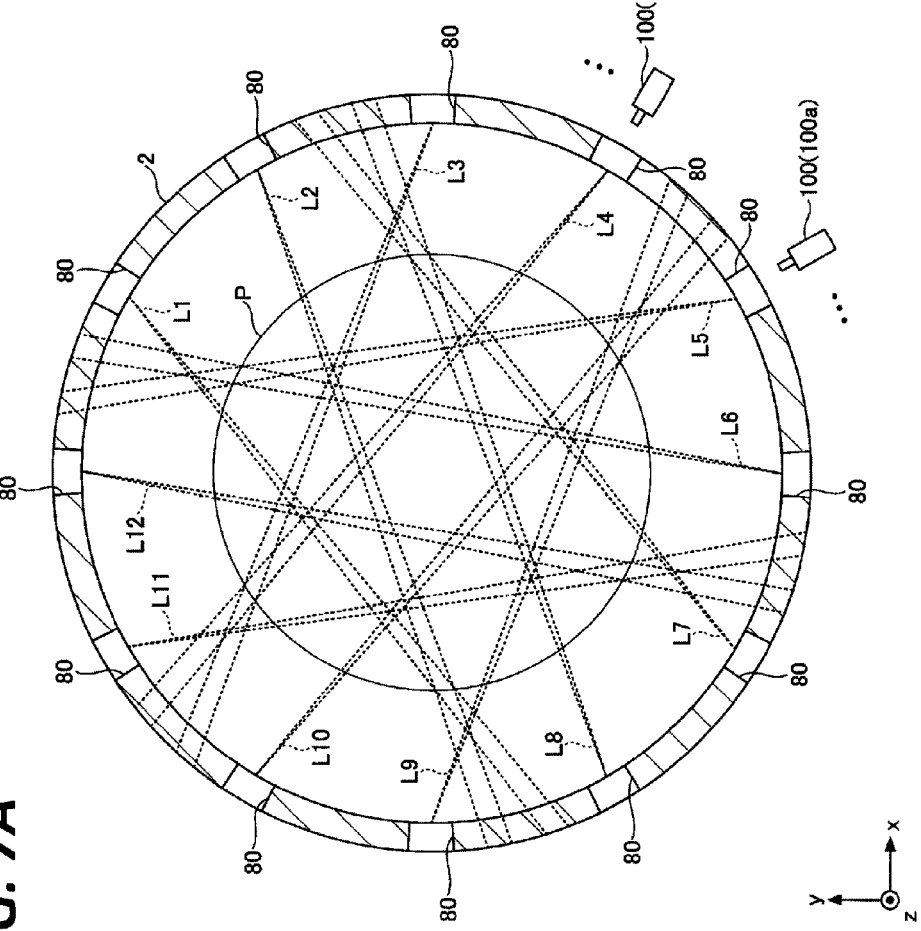
Figure 8A:
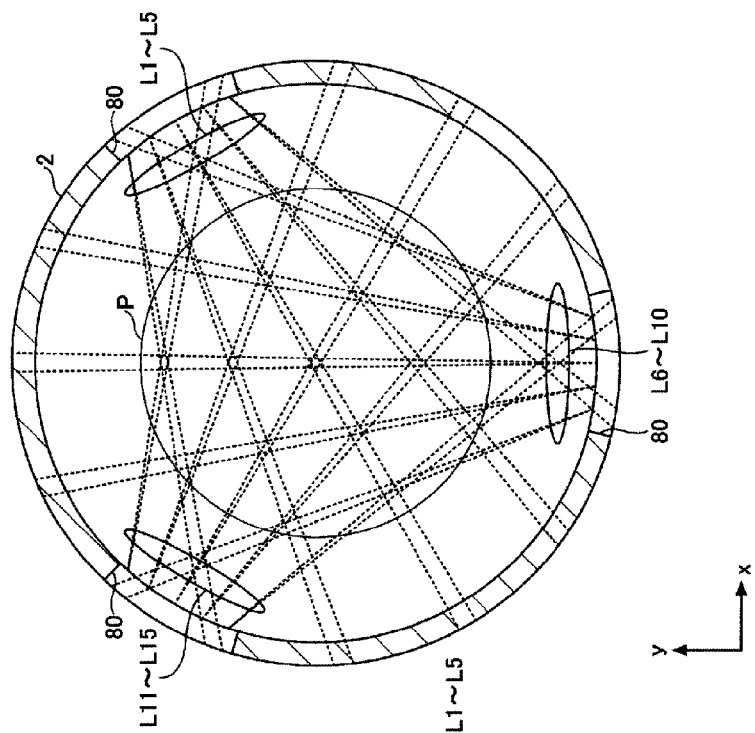
FIGS. 8A and 8B are views illustrating an exemplary plasma observation method according to a fourth embodiment.
Figure 8B:
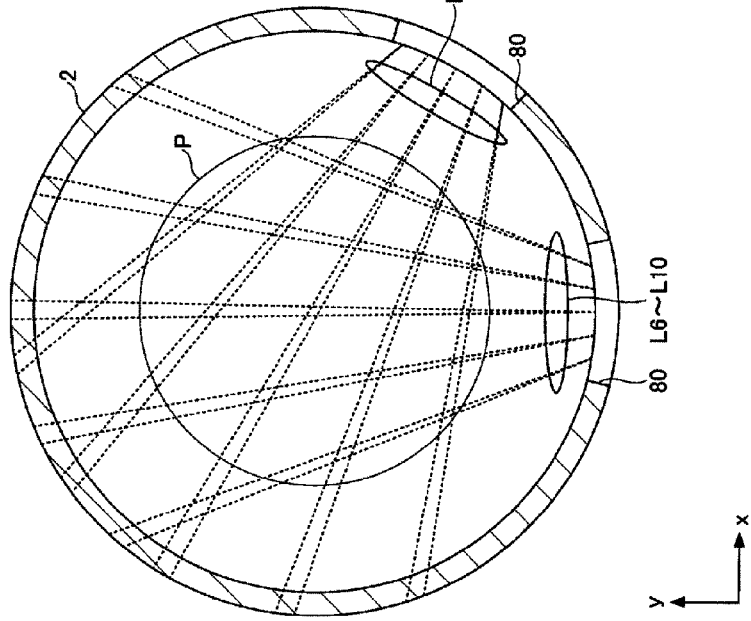

Examples of other plasma observation methods are illustrated in FIGS. 7A, 7B, 8A, and 8B. FIGS. 7A and 7B are views illustrating an exemplary plasma observation method according to a third embodiment. FIGS. 8A and 8B are views illustrating an exemplary plasma observation method according to a fourth embodiment.

In the plasma observation method according to the third embodiment illustrated in FIGS. 7A and 7B, 12 observation windows 80 are evenly arranged in the horizontal direction in the circumferential direction, as illustrated in FIG. 7A, to receive light beams L1 to L12. For example, the light beams L2, L4, L6, L8, L10, and L12, which are light beams incident from the center direction of the processing container 2 at a relatively shallower angle, are received by the light receiver 100. The light beams L1, L3, L5, L7, L9, and L11, which are light beams incident from the center direction of the processing container 2 at an angle relatively deeper than the light beam L2 and the like, are received by the light receiver 100. The light receivers 100a, 100b, illustrated in FIGS. 7A and 7B may be the same light receivers 100, or may be different light receivers 100. In FIG. 7A, a light receiver 100a for receiving light beam L5 and a light receiver 100b for receiving light beam L4 are illustrated. However, each observation window 80 is provided with a light receiver 100 for receiving light, and the light receiver 100 is configured to be shared by a plurality of observation windows 80.

Further, as illustrated in FIG. 7B, three observation windows 80 are arranged in the vertical direction of each observation window 80 illustrated in FIG. 7A, and the light receiver 100 is shared by using the rotary mirror method. In the plasma observation method according to the third embodiment, light beams are received at multiple angles by the observation windows 80 arranged on the circumference. Therefore, there are many intersections of the light beams, the resolution is high, and the plasma space 10S may be observed in a wide range.

In the plasma observation according to the fourth embodiment illustrated in FIGS. 8A and 8B, two observation windows 80 are arranged in the horizontal direction in the circumferential direction, as illustrated in FIG. 8A. Then, using the chopper method, the light beams L1 to L5 having different directions are received through one observation window 80, and the light beams L6 to L10 having different directions are received through the other observation window 80. Further, as illustrated in FIG. 8B, when the three observation windows 80 are evenly arranged in the horizontal direction in the circumferential direction, the number of observation points increases. Also in this case, using the chopper method, the light beams L1 to L5 having different directions are received through the first observation window 80, the light beams L6 to L10 having different directions are received through the second observation window 80, and the light beams L11 to L15 having different directions are received through the third observation window 80.

In the plasma observation method illustrated in FIG. 8A, it is possible to save the space in the installation area of the measuring device such as the light receiver 100. In the plasma observation method illustrated in FIG. 8B, there are more light intersections, the resolution is higher, and the plasma space 10S may be observed in a wider range, as compared with the plasma observation method illustrated in FIG. 8A.

In particular, in the case of a plasma processing apparatus that irradiates the processing container 2 with a microwave power from seven plasma sources (see FIG. 1), the plasma density in the circumferential direction tends to vary. Therefore, it is desirable to observe the plasma density in the circumferential direction. For this reason, the plasma observation method illustrated in FIGS. 7A and 7B or FIG. 8B is desirable in which light intersections (i.e., observation points) are relatively evenly distributed in the circumferential direction.

As described above, according to the plasma observation system and the plasma observation method of the embodiment, it is possible to easily specify an observation point of the plasma in the processing container 2 and determine the state of the plasma at the specified observation point. Further, the number of light receivers 100 may be reduced by the rotary mirror method. Further, even when a plurality of light receivers 100 are used, the plasma observation system may be constructed at a relatively low cost because the optical system components corresponding to the iris and the collimator are simply configured by the cylindrical member 101. Therefore, it is advantageous in terms of costs.

A light source may be separately provided as the plasma observation system. The light source may be a laser light source, an LED light source, or a lamp light source. The light source may be arranged on the opposite side of the light receiver 100, may be arranged on the light receiver 100 side, or may be built in the light receiver 100. For example, when the light receiver 100 has a built-in laser light source, the laser light source emits a laser beam having a certain wavelength toward the plasma space 10S. The laser beam is absorbed and attenuated by certain particles in the plasma generated in the plasma space 10S. The light receiver 100 receives the light beam reflected on the inner wall of the processing container 2 and returned to the observation window 80 while being attenuated in this way. From the received light beam, the controller 8 may specify an observation point of the plasma in the processing container 2 and determine the state of the plasma at the observation point.

The plasma processing apparatus of the present disclosure is a microwave plasma processing apparatus, but is not limited thereto. Any type of plasma processing apparatus such as an atomic layer deposition (ALD) apparatus, a capacitively coupled plasma (CCP), an inductively coupled plasma (ICP), an electron cyclotron resonance Plasma (ECR), and helicon wave plasma (HWP) may be applicable.

According to an aspect, it is possible to specify an observation point of the plasma in the processing container and determine the state of the plasma at the observation point.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A plasma observation system comprising:
    a plasma processing apparatus including a processing container in which a substrate is processed with plasma, and a plurality of observation windows each capable of observing an emission state of the plasma in the processing container;
    a light receiver configured to receive a plurality of light beams intersecting in the processing container through a plurality of observation windows;
    a plurality of rotary rods;
    a plurality of rotary mirrors fixed on each rotary rod at different angles and provided one-to-one with respect to the plurality of observation windows, the plurality of rotary mirrors configured to reflect the plurality of light beams incident through the plurality of observation windows toward the light receiver at different timings due to rotation of the rotary rod; and
    a controller configured to specify an observation point of the plasma and determine a state of the plasma at the observation point based on the plurality of light beams received by the light receiver by selectively positioning corresponding rotary rods at corresponding angles.

2. The plasma observation system according to claim 1, wherein the plasma processing apparatus further includes a plurality of plasma sources each configured to input a desired power into the processing container.

3. The plasma observation system according to claim 1, wherein the light receiver includes a directional pinhole configured to allow the light beams received by the light receiver to pass therethrough.

4. The plasma observation system according to claim 1, wherein the light receiver is shared by the plurality of observation windows.

5. The plasma observation system according to claim 4, wherein the light receiver is shared by the plurality of observation windows provided in a horizontal direction.

6. The plasma observation system according to claim 4, wherein the light receiver is shared by the plurality of observation windows provided in a vertical direction.

7. The plasma observation system according to claim 1, further comprising a chopper configured to divide a light beam incident through at least one of the plurality of observation windows into light beams in different directions, wherein the light receiver receives the light beams of different frequencies divided by the chopper.

8. The plasma observation system according to claim 1, wherein the state of the plasma is determined by an emission intensity of the plasma at a point where the light beams received by the light receiver intersect.

9. A method of observing plasma in a plasma processing apparatus, the method comprising:
- generating plasma in a processing container;
- positioning a plurality of rotary rods corresponding to a desired observation point;
- rotating each rotatory rod having a plurality of rotary mirrors fixed thereon at different angles, the rotary mirrors being provided one-to-one with respect to a plurality of observation windows provided in the processing container;
- receiving a plurality of light beams intersecting in the processing container through the plurality of observation windows via a light receiver;
- specifying the position where two or more received light beams intersect as an observation point of the plasma and determining a state of the plasma at the observation point based on the plurality of light beams received by the light receiver by selectively positioning corresponding rotary rods at corresponding angles.

10. The method according to claim 9, further comprising:
changing the state of the plasma in the processing container based on results of specifying the observation point and determining the state of the plasma.

11. The method according to claim 10, wherein the changing the state of the plasma includes controlling a pressure in the processing container.

12. The method according to claim 10, wherein the changing the state of the plasma includes controlling a microwave power input from each of a plurality of plasma sources into the processing container, for each plasma source.

13. The method according to claim 10, wherein the changing the state of the plasma includes controlling a flow rate of a gas supplied into the processing container.

14. The method according to claim 10, further comprising:
determining an end point of cleaning or an end point of etching in the processing container by changing the state of the plasma.

15. The method according to claim 10, wherein the specifying and the determining includes determining an end point of cleaning or an end point of etching at the observation point.

* * * * *